US007957543B2

(12) United States Patent
Matthey

(10) Patent No.: US 7,957,543 B2
(45) Date of Patent: Jun. 7, 2011

(54) LISTENING DEVICE

(75) Inventor: Marc Matthey, Neuchâtel (CH)

(73) Assignee: On Semiconductor Trading Ltd., Hamilton (BM)

( * ) Notice: Subject to any disclaimer, the term of this patent is extended or adjusted under 35 U.S.C. 154(b) by 738 days.

(21) Appl. No.: 11/375,031

(22) Filed: Mar. 15, 2006

(65) Prior Publication Data

US 2006/0222192 A1 Oct. 5, 2006

(30) Foreign Application Priority Data

Mar. 17, 2005 (EP) .................................... 05405248

(51) Int. Cl.
*H04B 15/00* (2006.01)
*H03G 5/00* (2006.01)
*G06F 17/00* (2006.01)

(52) U.S. Cl. ........... 381/94.2; 381/94.3; 381/98; 700/94

(58) Field of Classification Search ........ 381/94.1–94.3, 381/98, 101–103; 700/94; 708/320–323
See application file for complete search history.

(56) References Cited

U.S. PATENT DOCUMENTS 4,490,841 A * 12/1984 Chaplin et al. ............ 381/71.14
4,939,685 A * 7/1990 Feintuch ...................... 708/322
5,469,087 A * 11/1995 Eatwell .......................... 327/40
5,483,617 A 1/1996 Patterson et al.
5,745,581 A * 4/1998 Eatwell et al. ............ 381/71.11
5,757,937 A 5/1998 Itoh et al.
6,757,395 B1 6/2004 Fang et al.
2004/0175011 A1* 9/2004 Schaub ........................ 381/320
2004/0242157 A1 12/2004 Klinke

OTHER PUBLICATIONS

Boll, Steven F. "Suppression of Acoustic Noise in Speech Using Spectral Subtraction", Apr. 1979, IEEE, IEEE Transactions on Acoustics, Speech, and Signal Processing, vol. ASSP-27, No. 2, 113-120.*

* cited by examiner

*Primary Examiner* — Curtis Kuntz
*Assistant Examiner* — Jesse A Elbin
(74) *Attorney, Agent, or Firm* — Birch, Stewart, Kolasch & Birch, LLP

(57) ABSTRACT

In a listening device such as for example a hearing aid (1) where an input signal (10) is received by a microphone (2), converted from analog to digital (3), digitally processed (4) including a conversion from a time domain into a frequency domain, converted from digital to analog (5) and transmitted to a user by means of a loudspeaker (6), the internal digital processing (4) generates an unwanted noise signal, the so called undesired periodic noise (12), at specific frequencies. The undesired periodic noise is coupled via ground and the battery (7) into the signal processing path. According to the invention, the undesired periodic noise is filtered out of the input signal (10.2) during the digital signal processing (4), after the conversion of the digital signal into the frequency domain.

8 Claims, 3 Drawing Sheets

LISTENING DEVICE

TECHNICAL FIELD

The invention relates to a method for processing an analog acoustic signal, particularly for processing an audio signal in a listening device, including a step of converting the analog acoustic signal into a digital signal and a step of processing the digital signal including converting it from a time domain into a frequency domain, where a noise signal is generated by processing said digital signal and where said noise signal is superposed on said analog acoustic signal. The invention further relates to a corresponding processing device and a listening device with such a processing device.

BACKGROUND ART

In the development of audio equipment exists an ongoing trend towards smaller devices. This is particularly true in the development of listening devices such as for example hearing aids and headsets or similar devices which a user carries with him and which typically are worn in or at the ear or on the head.

In such listening devices, a signal, typically an analog input signal such as for example an acoustic or audio signal is received by means of a microphone or a signal input interface, processed and outputted as an analog output signal to one or more speakers or to a signal output interface. The processing of the analog input signal includes for example analog to digital (A/D) conversion, filtering, amplification, digital to analog (D/A) conversion and may also include other signal processing steps. For carrying out the digital processing, a listening device usually includes corresponding processing means such as for example a microprocessor or a dedicated digital signal processor (DSP).

In order to carry out the above signal processing, energy, typically in the form of electrical energy, is required. For this purpose, the device includes a power supply such as for example an accumulator or a battery that provides the necessary energy. Generally, it can be said that the more signal processing is carried out, the more power is consumed by the device. However, since power supplies typically add a considerable amount to the overall weight and size of the listening device, a tradeoff between the signal processing (power consumption) and the size and weight requirements has to be found.

In currently available listening devices the signal processing includes a step of conversion of the input signal between the time and the frequency domain. The further processing steps, for example a digital filtering, a signal compression or a signal features extraction, are usually carried out subsequently, in the frequency domain. The conversion and the other signal processing steps are usually carried out in blocks at regular time intervals, where each block processing results in a peak of current consumption. These regular or periodic power consumption peaks may cause a corresponding voltage variation and generate an unwanted noise signal at a particular frequency, namely the frequency of the block processing. This noise signal is called undesired periodic noise. Since the undesired periodic noise usually is not sinusoidal, additional undesired periodic noise at higher frequencies (the higher harmonics) is generated as well.

The undesired periodic noise is coupled into the signal processing path mainly through ground and the power supply that is common for all components and particularly for all signal processing subsystems of the listening device.

In order to eliminate or reduce this undesired periodic noise, additional external filters including passive elements such as capacitors, resistors and/or inductors have been introduced. It has for example been proposed to insert a capacitor between the power supply and ground. Another possibility is to insert a filter at the power input of each subsystem.

In listening devices, where the analog input signal is converted into a digital signal with an analog to digital converter (ADC), a further possibility is to add a second ADC the input of which being connected to ground (that allows to measure the noise) and the output of which being subtracted from the output of the signal ADC.

However, all of these known solutions result in additional components of the listening device. These additional components increase not only the size but also the weight and the price of the listening device and therefore contradict the above-mentioned requirements regarding the size and weight of a listening device.

SUMMARY OF THE INVENTION

It is the object of the invention to create a method pertaining to the technical field initially mentioned, that enables the manufacturing of listening devices that obviate or at least mitigate the disadvantages of the prior art, particularly the manufacturing of small, light and cost-efficient listening devices with a complete or at least partial suppression of the undesired periodic noise.

The solution of the invention is specified by the features of claim 1. In a method for processing an analog acoustic signal that includes a step of converting the analog acoustic signal into a digital signal and a step of processing the digital signal including converting it from a time domain into a frequency domain, where a noise signal is generated by processing the digital signal and where the noise signal is superposed on the analog acoustic signal, the step of processing the digital signal includes according to the invention a step of filtering said noise signal out of said digital signal after said conversion of the digital signal into the frequency domain.

According to the invention, the noise filtering, that is the suppression of the undesired periodic noise, is carried out after the conversion of the analog input signal into a digital signal. Therefore, there is no need to add further components to carry out the noise filtering, because the devices for processing the audio signals anyway include means for processing a digital signal such as for example a DSP. The suppression of the undesired periodic noise can for example be carried out by reprogramming a corresponding programmable device or by redesigning a corresponding hard-wired device.

The invention can be applied in any method where an acoustic input signal is A/D converted, where the resulting digital signal is converted into the frequency domain and where an undesired periodic noise is generated. However, in a preferred embodiment of the invention, the method is adapted for processing an audio signal in a listening device.

The conversion of the digital signal from the time domain to the frequency domain as well as the processing steps of the digital signal in the frequency domain are preferably carried out in digital subsystems of the listening device particularly by processing the signal in blocks at regular time intervals. The inverse of that time interval is the block processing frequency. The noise signal, that is the undesired periodic noise, is generated in at least one of these processing steps and has therefore a fundamental frequency equal to the block processing frequency. Usually, the undesired periodic noise also includes portions at the higher harmonic frequencies of the block processing frequency.

According to the invention, the suppression of the undesired periodic noise, that is the filtering of the noise signal out of the digital signal, can be carried out anytime after the conversion of the input signal between the time and the frequency domain, but typically before the processed digital signal is converted back to an analog signal with a digital to analog converter (DAC).

Because of the properties of the undesired periodic noise, it is much simpler (in term of complexity) to remove it in the frequency domain than to remove it in the time domain. Firstly, the undesired periodic noise has a constant energy, because the block computing is independent of the input signal and therefore similar for each block. It follows that the undesired periodic noise is independent of the acoustic input signal. Secondly, since the undesired periodic noise is generated by the device itself, it also has a constant phase. Due to its constant phase and energy and the properties of the time domain to frequency domain conversion, the undesired periodic noise is also constant in all the bands of the frequency domain.

It is to note that the signals that are processed by the listening device such as the analog input signal or an internal signal of the device may also include other noise signals such as for example white, Gaussian, non-Gaussian, band-limited, non-band-limited noise signals, different kinds of interference, quantisation noise or other noises and any combinations thereof. Such noise signals are generated either externally such as for example certain kinds of interference or internally such as for example the quantisation noise. Usually, a listening device such as a hearing aid includes means for suppressing/filtering these noise signals where these means may be implemented by discrete or integrated components or by digital filters implemented within the existing components of a listening device. It is to note that the invention deals with a different kind of noise, namely the above-mentioned block processing tone which is generated within the listening device by carrying out the digital signal processing.

The conversion of the digital signal from the time domain into the frequency domain may be carried out by applying a Fourier transform to the digital signal. In order to speed up the Fourier transform, the fast Fourier transform (FFT) algorithms are used. After the processing in the frequency domain, the digital signal is converted back from the frequency domain into the time domain by applying the corresponding inverse (fast) Fourier transform. Depending on the actual application, other time domain to frequency domain transformations such as DFT (Discrete Fourier Transform), Polyphase DFT, WOLA (Weighted OverLap-Add) filterbank, Pipeline frequency transform or wavelet transform may be appropriate.

When the digital signal is converted into the frequency domain, a series of a complex transformation values are determined. Since the undesired periodic noise is constant in the frequency domain, the effect of the undesired periodic noise in the frequency domain is similar to an offset value in the real and the imaginary part of each band affected by the undesired periodic noise. Because the phase and the energy of the undesired periodic noise are constant, all the offset values in the frequency domain are constant in time. It is therefore very simple to filter the effect of the undesired periodic noise out of a complex transformation value by employing these offset values as correction values. It is advantageously done by subtracting a first correction value from the real part of the complex transformation value and by subtracting a second correction value from the imaginary part of the complex transformation value. In other words two simple subtractions per affected bands are used to suppress the undesired periodic noise.

It is to note that the undesired periodic noise does not affect all complex transformation values of the digital signal in the frequency domain, but only those values that correspond to the block processing frequency and its higher harmonics. The other complex transformation values are not affected by the undesired periodic noise.

As mentioned above, the source for the undesired periodic noise is the variation in time of the power consumption due to the signal processing by block. Therefore, the effect of the undesired periodic noise depends on the particular application, for example on the particular processing algorithm or on the particular implementation (chip, hybrid, printed circuit board etc.) of the listening device.

It is possible to use fixed correction values or adaptive correction values for suppressing the undesired periodic noise. The fixed correction values could be determined during the manufacturing process based on a measurement of the offsets, based on a calibration procedure or based on experience. Since each algorithm (block computing) produces a different undesired periodic noise, the algorithm used to calibrate or to measure the offset values should produce the same undesired periodic noise than the algorithm used during the real application. Furthermore, since the signal also includes other noise such as for example white noise, the measuring period has to be sufficiently long, that is for example from some milliseconds up to one second. The correction values are stored in a non-volatile memory during the calibration procedure and are applied during the application.

However the undesired periodic noise can vary due to changes of any known or unknown factors. Such factors may include internal factors like for example battery conditions or dynamic changes in the signal processing but also environmental conditions like for example the temperature conditions (of the processing means or the whole listening device) or the intensity of possibly present electric or magnetic fields or with the ageing of the components. It is therefore preferred that the correction values are updated.

Because the undesired periodic noise has a constant phase and a constant energy, the mean values of the real part and the imaginary part of the frequency transformation of the undesired periodic noise are not zero for the affected bands. Because the input signal is not synchronised with the device then the input signal phase is not constant. Then the mean values of the real part and the imaginary part of the frequency transformation of the input signal are zero for all bands (when observing it for a sufficient period of time). The undesired periodic noise offset values can be efficiently removed with a high pass digital filter where said first and second correction values are updated after subtracting them from the real and imaginary parts of the complex transformation value respectively.

Three main classes of high pass digital filters can be used:

Finite Impulse Response (FIR) filters,

Infinite Impulse Response (IIR) filters,

Adaptive filters.

The choice of the filter type, FIR, IIR or adaptive, depends on the application and the specification of the desired noise reduction.

A FIR can be used to remove the undesired periodic noise offset values but the complexity of the FIR filter has to be very high to efficiently reduce the undesired periodic noise without removing a part of the wanted acoustic signal.

A DC blocker (IIR high pass filter) is more efficient than the FIR filter. This filter is a small recursive filter specified by the equation:

$$y(n)=x(n)-x(n-1)+C*y(n-1)$$

where y(n) is the output of the filter (corrected band value), x(n) is the input of the filter (band value that contains the undesired periodic noise offset), y(n−1) is the previous value of the output and x(n−1) is the previous value of the input. C is a parameter that adjusts the cut-off frequency of the filter. The Z-transform function of the DC blocker is:

$$H(z)=(1-z^{-1})/(1-Cz^{-1})$$

The DC blocker filter has a zero (z=1) and a pole (z=C). Note that the filter is stable if and only if C is in the interval [−1, 1]. C is the parameter which is typically somewhere between 0.95 and 0.999. However this filter is very sensitive to the quantification noise. It is therefore preferred to use another structure of filter.

Another structure of high pass IIR filter can be used. The equation of the filter is the following:

$$y(n)=x(n)-e(n)/N$$

$$e(n)=e(n-1)+y(n)$$

where y(n) is the output of the filter (corrected band value), x(n) is the input of the filter (band value that contains the undesired periodic noise offset), e(n) is an accumulation value of the output of the filter and N is a parameter that adjusts the cut-off frequency of the filter. The Laplace transfer function of this filter is:

$$H(z)=C*(1-z^{-1})/(1-Cz^{-1})$$

$$\text{with } C=N/(N+1)$$

This filter has a zero (z=1/C) and a pole (z=C). Note that the filter is stable if and only if N is a positive number.

The starting values for the correction values x(0), y(0) and for the filter parameter e(0) (where applicable) can be chosen arbitrarily. They may for example be chosen to be zero or they may be chosen at random. In order to speed up the convergence of the filter, it is preferred that initial values for x(0), y(0) and e(0) are set based on experience. Particularly e(0) is preferably chosen such that it is close to the expected correction value multiplied by N.

This IIR structure is very stable and efficient to remove the undesired periodic noise. The N parameter is chosen to tune the cut-off frequency of the filter. It is preferred that the value of N is a power of two. Then a right shift operation could be used to carry out the division instead of a true division operation. N value is typically somewhere between 64 and 32768.

When a big value for the N parameter is chosen, the filter removes the undesired periodic noise without removing a part of the wanted input signal. Nevertheless, the bigger the value of N is, the longer is the convergence time for the filter.

To speed up the convergence of the filter, the N parameter could be increased in stages during the application. For example at the start of the application, the N parameter could be set to a initial value N1 and after a delay D the N parameter is set to a value N2. When the parameter N is changed, the accumulation value e(n) of the filter needs to be adjusted. The e(n) is multiplied by the ratio N2/N1 during the N parameter adaptation. If N2 and N1 value are a power of two values, the multiplication by the ratio N2/N1 can be carried out with a left shift operation. This N parameter adaptation stage can be repeated several times during the application.

As outlined above, a complex transformation value includes portions of the input signal as well as portions of the undesired periodic noise. Since the energy of the undesired periodic noise is assumed to be small, only those complex transformation values that have a small energy level are considered for the adaptation of the offset values. That is, complex transformation values having a high energy level are not considered for the adaptation of the correction values. If the high energy values would be considered too, it may happen that the correction values converge too slowly or that they do not converge at all.

So, in a preferred embodiment of the method according to the invention a threshold detection step is carried out which determines whether the correction values are updated or not after the processing of a complex transformation value. For doing this, the energy of a complex transformation value is compared to a given threshold and the first and second correction values are updated only when the energy of the complex transformation value is smaller than the threshold value. If this energy is greater than the threshold, the correction values are not updated and remain unchanged.

The A/D conversion of the analog acoustic input signal into the digital input signal is typically done by sampling the analog input signal with a given sampling rate or sampling frequency. According to the Nyquist-Shannon sampling theorem, the sampling frequency has to be equal to or greater than twice the highest frequency of interest in the input signal in order to be able to reconstruct the original signal completely from the sampled version.

For the processing of the digital input signal, the usable frequency range, that is the frequency range from 0 Hz to half the sampling frequency, is divided into a plurality of frequency bands where the step of processing the digital signal is carried out for each frequency band separately. However, as already mentioned above, the undesired periodic noise does not affect the whole usable frequency range, but only some specific frequency ranges, particularly the frequencies that correspond to the block processing frequency and its higher harmonics. In other words, the undesired periodic noise affects only some of the frequency bands in which the usable frequency range is divided. The highest energy of the undesired periodic noise is present in the frequency band that includes the block processing frequency. So, in a preferred embodiment of the invention, the step of filtering the undesired periodic noise out of the digital signal is carried out for at least one of these frequency bands where this frequency band typically is the one that includes the block processing frequency. In order to enhance the undesired periodic noise suppression, the noise filtering is also carried out for the other affected frequency bands which are the bands that include the higher harmonics of the block processing frequency.

A listening device according to the invention includes an ADC for converting an analog acoustic input signal into a digital input signal, a processing device for processing said digital input signal and determining a digital output signal, including converting the digital input signal from a time domain into a frequency domain, and a DAC for converting the digital output signal into an analog output signal. The processing device is therefore connected to the ADC as well as the DAC. It is to be understood that a listening device may also include further elements such as for example electroacoustic converters like microphones or loudspeakers, peripherals, interfaces, power supplies, memory units and so forth.

The processing device processes the digital input signal at regular time intervals whereby a noise signal is generated. In other words, the processing device is built such that said noise signal is generated when the digital input signal is processed. Due to the specific implementation of the listening device, this noise signal is coupled onto the analog input signal. In other words, the listening device is built such that the noise signal is superposed on the analog acoustic input signal.

According to the invention, the processing device includes filtering means for filtering said noise signal out of said digital input signal after the conversion of the digital input signal into the frequency domain.

The processing device for processing the digital input signal and filtering the noise signal can for example be manufactured by means of discrete components or it can be implemented by a dedicated hardware unit. Because of the size and weight requirements on such listening devices, the processing device is preferably implemented as an integrated circuit on a programmable microchip.

Other advantageous embodiments and combinations of features come out from the detailed description below and the totality of the claims.

BRIEF DESCRIPTION OF THE DRAWINGS

The drawings used to explain the embodiments show.

In the figures, the same components are given the same reference symbols.

PREFERRED EMBODIMENTS

Figure 1:
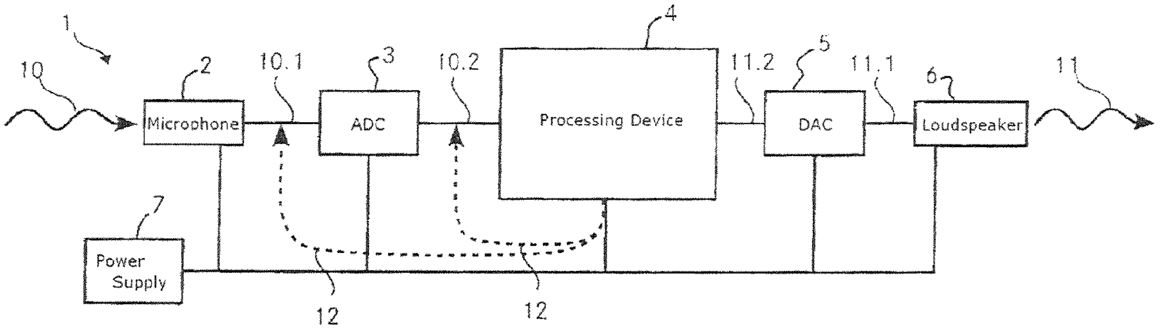
FIG. 1 shows a schematic illustration of a hearing aid according to the invention.

FIG. 1 shows a schematic illustration of a hearing aid 1 according to the invention. The hearing aid 1 includes several components: a microphone 2, an analog to digital converter (ADC) 3, a processing device 4, a digital to analog converter (DAC) 5, a loudspeaker 6 and a power supply 7 which in this case is a battery. For supplying the components with electric energy, all or some of the components are connected to the power supply 7.

A hearing aid enables for example a deaf user to hear and/or understand an analog audio input signal which he otherwise can not hear or understand. The analog input signals are for example sound waves such as a speech signal from a conversational partner mixed with other sounds and noises such as for example the voices of other people, the buzzing of a running computer or other background noises such as traffic noise. It is a task of the hearing aid to convert the analog input signal into an output signal that can be heard and/or understood by the user. This signal conversion includes for example an amplification of certain or all frequency ranges and/or filtering the input signal. The signal processing is done corresponding to the users' hearing deficiency.

The hearing aid 1 of FIG. 1 receives input sound waves 10, for example a noisy speech, by means of the microphone 2 that converts the sound waves 10 into an analog input signal 10.1. The ADC 3 converts the analog input signal 10.1 into a digital input signal 10.2 that is processed by the processing device 4. The DAC 5 converts the digital output signal 11.2 of the processing device 4 into an analog output signal 11.1 which is transmitted to the user as output sound waves 11 by means of the loudspeaker 6.

While processing the digital input signal 10.2, the processing device 4 consumes current from the power supply 7. The signal processing is done for a specific block of input data where each block is processed at regular time intervals T. The frequency of the data processing is called the block processing frequency $f_{BP}=1/T$ and is determined as the sampling frequency divided by the block size of the hearing aid. Therefore, every time interval T, a certain amount of current is consumed to carry out the block processing of the input signal. These regular peaks of current consumption periodically lower the output voltage of the power supply.

If for example the sampling frequency $f_S$ in the hearing aid 1 is 16 kHz (kilo Hertz) and the block size R of the block processing is R=8, the block processing frequency $f_{BP}$ is determined as $f_{BP}=f_S/R=16$ kHz/8=2 kHz.

Figure 2:
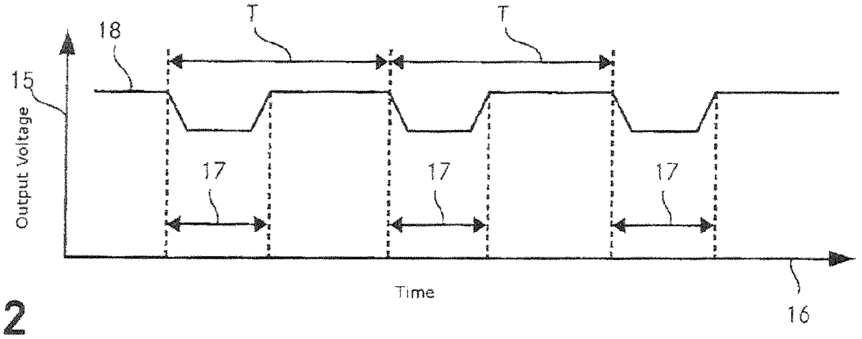
FIG. 2 shows the generation of the undesired periodic noise.

FIG. 2 shows this voltage variation. The diagram illustrates the output voltage 15 of the power supply 7 against time 16. The periodic current consumption during the signal processing 17 occurs every time interval T. Hence, the voltage 18 of the power supply 7 varies with the same frequency $f_{BP}=1/T$.

This periodic variation of the power supply 7 voltage 18 generates a sound that is called the undesired periodic noise at the frequency corresponding to the block processing frequency $f_{BP}$. Via the power supply, this undesired periodic noise is superposed onto the signal processing path of the hearing aid 1 and interferes with the wanted audio input signal. The undesired periodic noise is coupled either on the digital input signal 10.2 and/or the analog input signal 10.1 which is illustrated by the arrows 12. Since this signal coupling is unwanted, the noise is referred to as undesired periodic noise.

In other words, the digital input signal processing that is carried out by the processing device 4 generates the undesired periodic noise that is superposed on the digital input signal 10.2 to be processed by the processing device 4 via the power supply 7.

Figure 3:
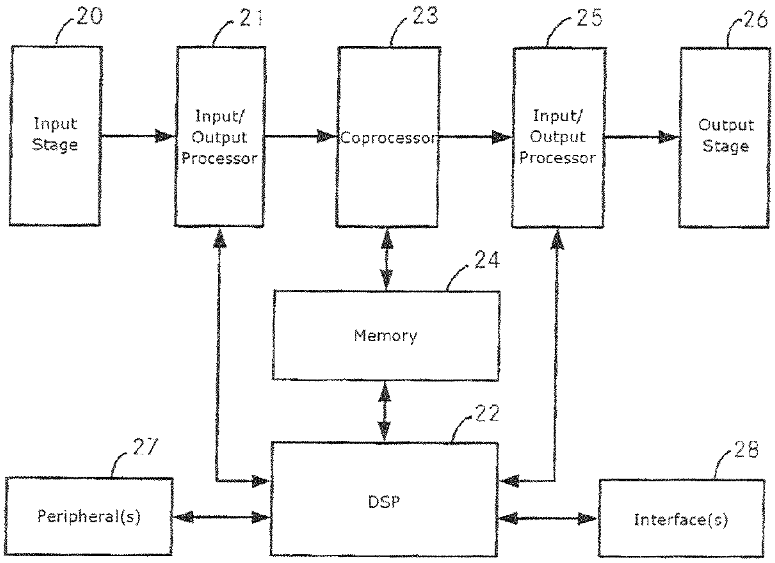
FIG. 3 shows a more detailed schematic illustration of the hearing aid of FIG. 1.

FIG. 3 shows a more detailed schematic illustration of the hearing aid of FIG. 1. In a typical application, the input stage 20 includes two microphones followed by a multiplexer, a preamplifying, an analog to digital conversion and a downsampling. The input stage 20 may include further input channels for telecoils (that enable the hearing aid 1 to be used directly with hearing-aid compatible telephones and listening devices) and/or a direct audio input (DAI). The input stage is connected to an input/output processor 21 which includes an input FIFO (first in first out) memory for buffering the symbols of the digital input signal 10.2 for further processing. The input/output processor 21 is connected to a DSP (digital signal processor) 22 that performs the digital signal processing. The DSP 22 is assisted by a coprocessor 23 that performs the block-based signal processing and which is also connected to the input/output processor 21. The DSP 22 and the coprocessor 23 share a common memory 24. The DSP 22 and the coprocessor 23 are connected to an input/output processor 25 with an output FIFO memory that buffers the output of the DSP 22 and the coprocessor 23, that is the symbols of the digital output signal 11.2. The input/output processor 25 is followed by the output stage 26 which performs the upsampling where required and the digital to analog conversion and includes the output drivers for driving the loudspeaker(s). The hearing aid 1 may further include one or a plurality of interfaces 28 as well as peripherals 27 such as for example timers (watchdog timer, general-purpose timer), a power-on reset, a battery monitor, an interrupt controller, a clock management and/or a power management.

Here, the processing device 4 includes the conversion of the digital input signal from the time domain into the frequency domain. This is done by applying a WOLA (Weighted OverLap-Add) analysis. The WOLA analysis results are a series of complex transformation values that represent the digital input signal 10.2 in the frequency domain. The complex transformations are shared between the DSP 22 and the coprocessor 23 with the common memory 24. In the frequency domain, the converted input signal is further processed according to the requirements of the specific application. Then, the processed signal is converted back from the frequency domain into the time domain with a WOLA synthesis.

The block processing carried out by the processing device 4 and therewith the consumed current is very similar for each data block. That is the voltage variation of the power supply is independent of the digital input signal. That is why the energy of the undesired periodic noise, which is caused by the block processing, is substantially constant. Furthermore, since the undesired periodic noise is generated by the processing device 4, it also has a constant phase.

When the digital input signal is converted into the frequency domain, the undesired periodic noise, that is superposed on the digital input signal, is also converted into the frequency domain. Due to its characteristics (constant phase and energy), the undesired periodic noise appears as offset values of the real and the imaginary parts of some complex transformation values.

For a more efficient overall signal processing, the digital input signal is split into a plurality of frequency bands and each frequency band is processed separately. The number of frequency bands depends on the WOLA analysis band resolution that is applied. In the example shown, a WOLA analysis with 16 bands is used. The number of frequency bands preferably corresponds to the size of the FFT that is a part of the WOLA analysis processing. To compute a WOLA analysis with a resolution of 16 frequency bands, a 32-point FFT is used. Therefore, the usable frequency band is divided into 16 frequency bands. As mentioned above, the sampling frequency $f_S$ is 16 kHz. Due to the sampling theorem, the usable frequency range is half the sampling frequency, that is 8 kHz. So the width of each of the 16 frequency bands is $(f_S/2)/16=8$ kHz/16=500 Hz (Hertz).

Depending of the channel stacking (even or odd) arrangement of the FFT, the frequency band k is centered at the frequency:

$f_k=k*f_S/(2*N)$ for even stacking, $f_k=k*f_S/(2*N)+f_S/(4*N)$ for odd stacking, where N: number of bands, $f_S$: sampling frequency, k: [0,N−1] band indice, $f_k$: middle frequency of the band k.

In the example shown, an even stacking FFT is used.

As outlined above, the undesired periodic noise does not affect all of these frequency bands but only the bands that contain the block processing frequency $f_{BP}$ and its higher harmonic frequencies with numbers (n/2)/R where R is the block size and where n is an integer. Therefore, the bands number 4, 8 and 12 are affected by the undesired periodic noise. To remove the undesired periodic noise, it is sufficient to subtract an offset value from each real and imaginary part of each complex transformation value. The undesired periodic noise filtering in the frequency domain is carried out by the DSP 22 on the complex transformation values affected by the undesired periodic noise.

Figure 4:
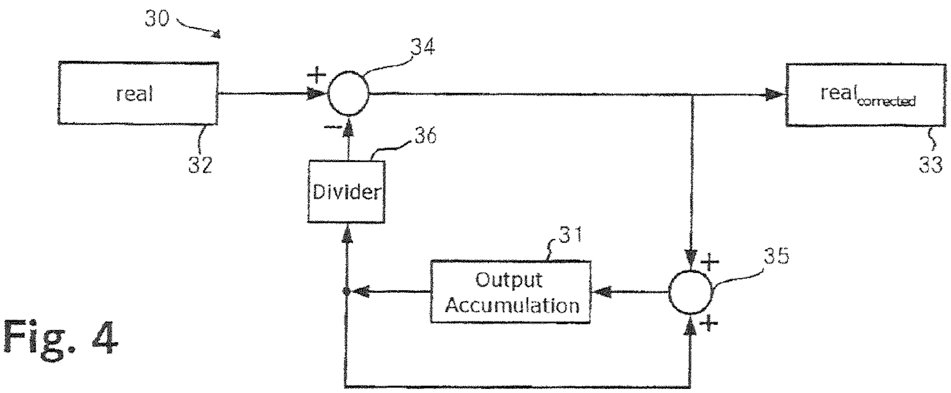
FIG. 4 shows a block diagram of a filter structure for filtering the undesired periodic noise.

FIG. 4 shows a block diagram of a filter structure for filtering the undesired periodic noise out of the digital input signal in the frequency domain. Because the filter structure is the same for the real and the imaginary part of the complex transformation values as well as for each affected frequency band, the filter 30 is shown only for the real parts of the complex transformation values of the frequency band number four. Although the structure of the filter 30 is the same, the offset values typically are different for each frequency band as well as for the real and the imaginary part of a specific frequency band.

Before the filtering starts, either a predefined or a random value is loaded as an initial value for the output accumulation 31. Then, the undesired periodic noise in the real part 32 of the first complex transformation value is suppressed by subtracting the output of the divider 36 from the real part 32 with a subtractor 34. The output of the divider 36 is the output accumulation 31 divided by a divisor. The divider 36 serves for adjusting the adaptation rate of the correction value. The larger the divisor, the slower the adaptation rate. Because the undesired periodic noise is constant, the adaptation rate could be very slow (large divisor). If the adaptation is too fast (small divisor), the filter could remove a part of the input signal. However, with a large divisor, it may happen that the correction value does not converge fast enough. In the example shown, a divisor of 256 is chosen such that the output accumulation 31 is first divided by 256 before it is subtracted from the real part 32. The division is can be performed with a right shift operator.

The corrected real part 33 is forwarded for further processing by the processing device 4. Then, the output accumulation 31 is updated. The updating is carried out by replacing the current output accumulation 31 by the sum of the current output accumulation 31 and the corrected real part 33. This sum is formed by an adder 35. With the updating of the output accumulation 31, the real part processing of a specific complex transformation value is finished. That is, the imaginary part of the same complex transformation value is processed and then the filtering is continued with the next complex transformation value until each value of each affected band has been processed.

It is to note that the correction of the complex transformation values may take place completely serially. However, the filtering may also take place in parallel. That is the real and/or imaginary parts of two or more complex transformation values from the same or different frequency bands may be processed simultaneously. The filter structure shown in FIG. 4 corrects all the complex transformation values affected by the undesired periodic noise (either real or imaginary part) in parallel.

Figure 5:
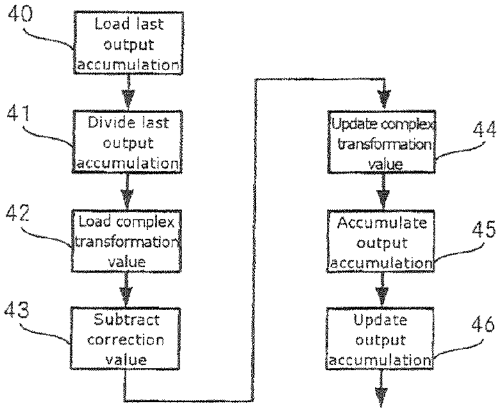
FIG. 5 shows a flowchart of an implementation of the filter structure of FIG. 4.

FIG. 5 shows a flowchart of the filtering method for a software-implementation. The program starts with a step “load last output accumulation” 40 followed by determining a correction value with a step “divide last output accumulation” 41 by the divisor which is 256 in the example shown. The next step is “load the complex transformation value” 42 and correct the loaded value in a step “subtract correction value” 43 from the loaded complex transformation value. In the next step “update the complex transformation value” 44 the loaded value is replaced by the corrected complex transformation value. The next step “accumulate output accumulation” 45 serves for determining an updated output accumulation value which replaces the old output accumulation value in the step "updating output accumulation" 46.

Figure 6:
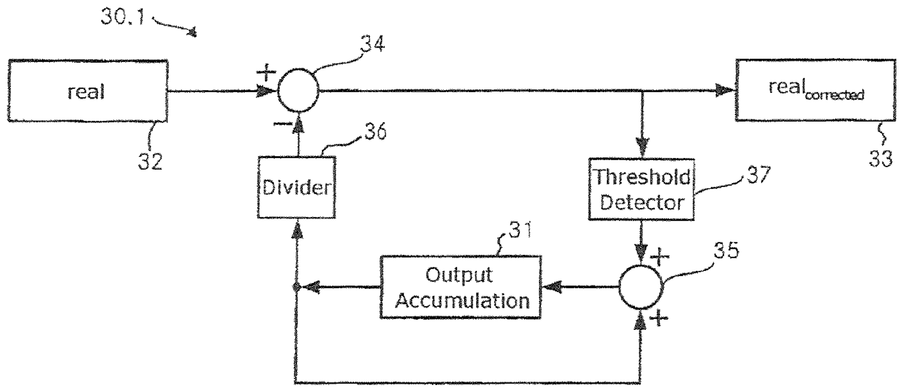
FIG. 6 shows a block diagram of another filter structure for filtering the undesired periodic noise.

In FIG. 6, a block diagram of a further filter structure for filtering the undesired periodic noise out of the digital input signal in the frequency domain is shown. This filter 30.1 is very similar to the filter 30 shown in FIG. 4. The only difference is that this filter 30.1 includes a threshold detector 37. Again, this filter structure is the same for the real and the imaginary parts of a complex transformation value as well as for the values of different frequency bands. Therefore, the filter 30.1 only shows the processing of the real part 32 of complex transformation value. This threshold detector 37 only has an effect on the adaptation of the output accumulation 31. Before the output accumulation 31 is updated, the threshold detector 37 compares the corrected real part 33, or to be precise its absolute value, to a given threshold. It detects whether the absolute value of the corrected real part 33, which corresponds to the energy of the original analog input signal in the corresponding frequency range, is higher or lower than the given threshold value. If so, the output accumulation 31 remains unchanged because it is assumed that a signal portion with an energy higher than the threshold originates from the analog input signal and not from the undesired periodic noise. If the signal energy in the analysed frequency range is smaller than the threshold, the output accumulation 31 is updated. Further, the output accumulation 31 is updated as described in connection with FIG. 4. Namely by replacing the output accumulation offset 31 by the output of the adder 35, that is the sum of the output accumulation offset 31 and the corrected real part 33.

Due to the fact that all the complex frequency transformation values of the digital input signal have substantially no DC portion, which means that its mean value is substantially zero (when observing it for a sufficient period of time), the filter 30.1 suppresses the undesired periodic noise very efficiently when the adaptation of the correction value has stabilised.

Figure 7:
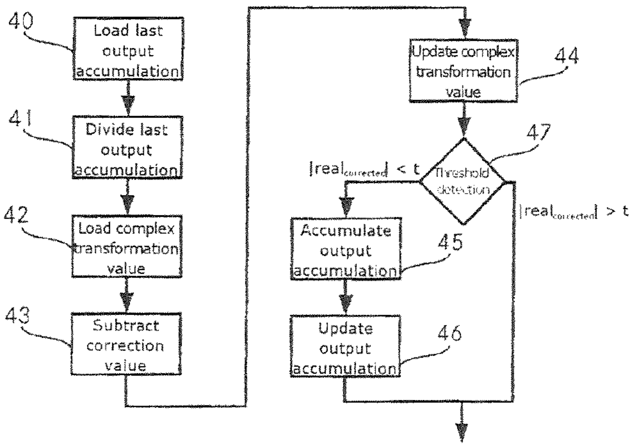
FIG. 7 shows a flowchart of an implementation of the filter structure of FIG. 6.

In FIG. 7 a flowchart for implementing the filter 30.1 is shown. This flowchart is also very similar to the flowchart of FIG. 5. In fact, the steps "load last output accumulation" 40, "divide last output accumulation" 41, "load the complex transformation value" 42, "subtract correction value" 43 and "update the complex transformation value" 44 are identical for both flowcharts. In the flowchart of FIG. 7 then follows a step "threshold detection" 47, where the absolute value of the corrected real part of the complex transformation value is compared to a threshold. If the absolute value of the corrected real part is higher than the threshold, nothing is done and the method is executed for the next real (or imaginary) part. If the absolute value is lower than the threshold, the output accumulation is updated in the steps "accumulate output accumulation" 45 and "updating output accumulation" 46 as described in connection with FIG. 5. In the example described above, the threshold is chosen to be 32.

A program such as described by means of the flowcharts of FIGS. 5 and 7 is very efficient in filtering the undesired periodic noise. It requires only a couple of cycles of the processing device such as for example the coprocessor 23 shown in FIG. 3.

Figure 8:
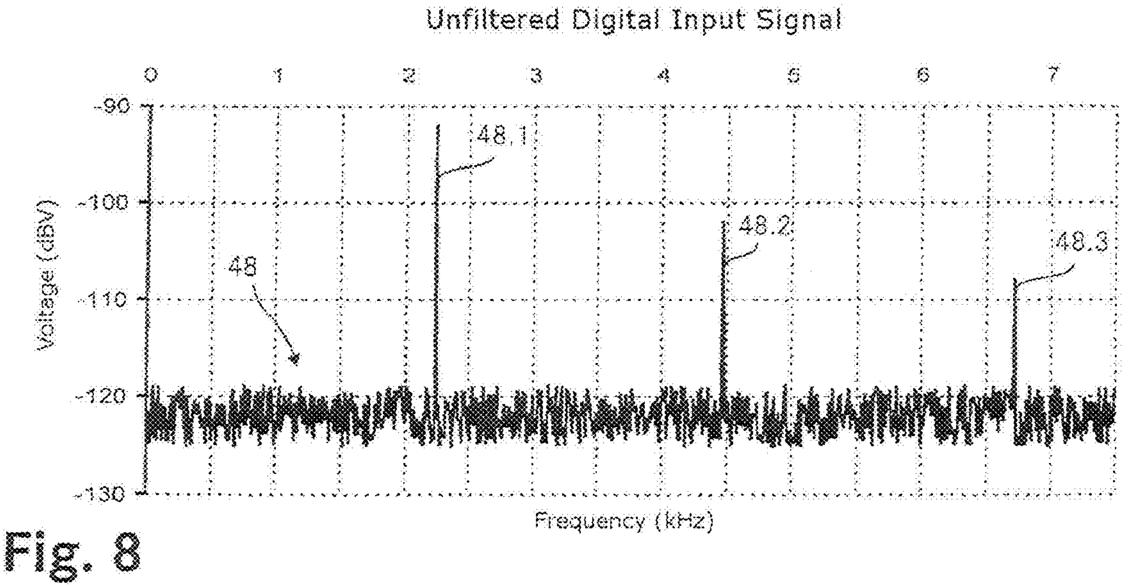
FIG. 8 shows a series of complex transformation values without undesired periodic noise correction and FIG. 9 shows a series of complex transformation values with undesired periodic noise correction.
Figure 9:
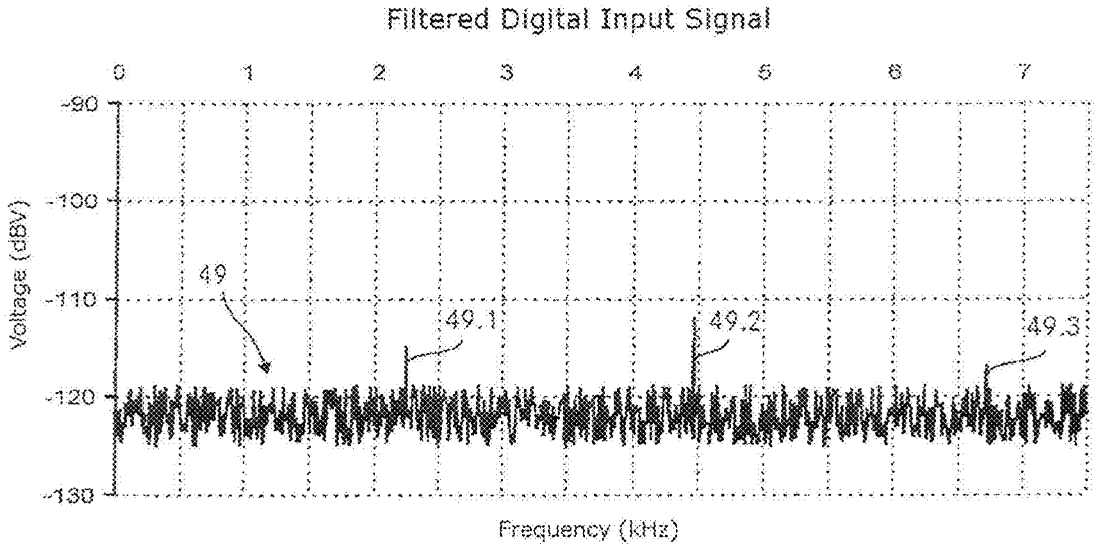

A result of the undesired periodic noise filtering according to the invention is schematically shown in FIGS. 8 and 9. Both figures show a diagram with a digital input signal connected to the ground in dBV (the voltage of the digital input signal relative to one Volt in decibels) against the frequency of the digital input signal in kHz. FIG. 8 shows the unfiltered digital input signal 48 that includes undesired periodic noise which is visible as three peaks 48.1, 48.2, 48.3 at about 2.24 kHz, 4.48 kHz and 6.72 kHz. The sampling frequency is 17.92 kHz.

FIG. 9 shows the filtered digital input signal 49, that is with a reduced undesired periodic noise which is filtered out according to the invention. Compared with the peaks 48.1, 48.2, 48.3 of the unfiltered signal, the peaks 49.1, 49.2, 49.3 of the filtered signal are remarkably reduced. It is to note that the diagrams have a logarithmic scale.

In order to reduce the undesired periodic noise, it is sufficient to filter the complex transformation values of at least one of the frequency bands. If only one band is filtered, the best filter effect typically is obtained when the frequency band which includes the block processing frequency is filtered. That is because the energy of the undesired periodic noise typically is higher at its fundamental frequency than at its higher harmonics. However, in order to enhance the undesired periodic noise filtering, other frequency bands can be filtered too. The best filter result is obtained when all affected frequency bands up to half the sampling frequency are filtered. In FIG. 9, the affected bands four, eight and twelve are filtered.

In summary, it is to be noted that the invention enable listening devices with an efficient filtering of the undesired periodic noise which is generated by the signal processing within the listening device without the need to add further discrete or integrated components to the listening device and therefore without increasing the size, the weight and the price of the listening device.

The invention claimed is:

1. A method for processing an analog acoustic signal, particularly for processing an audio signal in a listening device, the method comprising:

converting the analog acoustic signal into a digital signal; and processing the digital signal for specific blocks of input data at a block processing frequency, wherein said processing of said digital signal results in a noise signal superposed on the digital signal, the processing comprising:

converting the digital signal from a time domain into a frequency domain, splitting the frequency domain of the digital signal into a plurality of frequency bands, each frequency band being processed separately, determining the frequency bands affected by the noise, and filtering, in each determined frequency band, said noise signal out of said digital signal after said conversion of the digital signal into the frequency domain, wherein converting the digital signal from a time domain to a frequency domain includes determining a complex transformation value, where said noise signal is, for each determined frequency band, filtered out of said complex transformation value by subtracting a first correction value from a real part of said complex transformation value to obtain a corrected real value and by subtracting a second correction value from an imaginary part of said complex transformation value to obtain a corrected imaginary value, and when the absolute value of the corrected real value is below a predetermined threshold value, the frequency band is determined to include the noise signal.

2. The method according to claim 1, wherein said noise signal is filtered out with a highpass digital filter where said first and second correction values are updated after subtracting them from the real and imaginary parts of said complex transformation value respectively.

3. The method according to claim 2, wherein a first initial value is set for said first correction value, and a second initial value is set for said second correction value.

4. The method according to claim 3, wherein said analog acoustic signal is converted into said digital signal with a given sampling frequency, a frequency range from 0 Hz to half the sampling frequency being divided into a plurality of frequency bands where said step of filtering said noise signal out of said digital signal is carried out for a subset of said frequency bands.

5. The method according to claim 2, wherein said analog acoustic signal is converted into said digital signal with a given sampling frequency, a frequency range from 0 Hz to half the sampling frequency being divided into a plurality of frequency bands where said step of filtering said noise signal out of said digital signal is carried out for a subset of said frequency bands.

6. The method according to claim 1, wherein said analog acoustic signal is converted into said digital signal with a given sampling frequency, a frequency range from 0 Hz to half the sampling frequency being divided into a plurality of frequency bands where said step of filtering said noise signal out of said digital signal is carried out for a subset of said frequency bands.

7. A listening device, particularly a hearing aid, comprising:

an analog to digital converter that converts an analog acoustic input signal into a digital input signal;

a processing device that processes said digital input signal and determines a digital output signal, including converting the digital input signal from a time domain into a frequency domain; and a digital to analog converter that converts the digital output signal into an analog output signal, wherein the processing device is connected to said analog to digital converter and to said digital to analog converter, said processing device being built such that it processes said digital input signal for specific blocks of input data at a block processing frequency thereby generating a noise signal, said noise signal being superposed on said digital input signal, said processing device comprising a frequency domain splitter that splits the frequency domain of the digital input signal into a plurality of frequency bands, a determination unit that determines frequency bands affected by the noise and a filtering unit that for each determined frequency band filters said noise signal out of said digital input signal after said conversion of the digital input signal into the frequency domain, and converting the digital input signal from a time domain into a frequency domain includes determining a complex transformation value, where said noise signal is, for each determined frequency band, filtered out of said complex transformation value by subtracting a first correction value from a real part of said complex transformation value to obtain a corrected real value and by subtracting a second correction value from an imaginary part of said complex transformation value to obtain a corrected imaginary value, and each frequency band is determined to affected by the noise when the absolute value of the corrected real value is below a predetermined threshold value.

8. The processing device for processing a digital input signal with a superposed noise signal and determining a digital output signal for a listening device as claimed in claim 7, wherein said processing device is implemented as an integrated circuit on a programmable microchip and includes said filtering unit that filters said noise signal out of said digital input signal.

* * * * *